(12) United States Patent
Gawlowski et al.

(10) Patent No.: US 10,616,993 B1
(45) Date of Patent: Apr. 7, 2020

(54) HEATSINK BACKING PLATE

(71) Applicant: Arista Networks, Inc., Santa Clara, CA (US)

(72) Inventors: Matthew Gawlowski, Santa Clara, CA (US); Richard Hibbs, Santa Clara, CA (US); Ernie Thurlow, Santa Clara, CA (US); Tiong Khai Song, Santa Clara, CA (US); Robert Wilcox, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 15/871,835

(22) Filed: Jan. 15, 2018

(51) Int. Cl.
*H05K 1/02* (2006.01)
*H05K 7/20* (2006.01)
*H01L 23/40* (2006.01)

(52) U.S. Cl.
CPC ....... *H05K 1/0204* (2013.01); *H01L 23/4006* (2013.01); *H05K 1/0203* (2013.01); *H05K 7/20336* (2013.01); *H05K 7/20418* (2013.01); *H05K 7/20436* (2013.01); *H05K 7/20454* (2013.01); *H05K 7/20509* (2013.01); *H01L 2023/4062* (2013.01); *H01L 2023/4087* (2013.01)

(58) Field of Classification Search
CPC ......... H01L 23/4006; H01L 2023/4062; H01L 2023/4087; H01L 2023/4082; H05K 1/0203; H05K 7/20436
See application file for complete search history.

(56) References Cited

U.S. PATENT DOCUMENTS

| | | | | |
|---|---|---|---|---|
| 5,473,510 A * | 12/1995 | Dozier, II | ........... | H01L 23/4006 174/548 |
| 5,883,782 A * | 3/1999 | Thurston | ............. | H01L 23/4006 257/718 |
| 5,978,223 A * | 11/1999 | Hamilton | ............ | H01L 23/4093 165/185 |
| 6,042,388 A * | 3/2000 | Tustaniwskyj | ......... | H01R 12/57 439/66 |
| 6,208,515 B1 * | 3/2001 | Klein | .................... | H05K 7/1084 174/383 |
| 6,331,937 B1 * | 12/2001 | Bartyzel | ............. | H01L 23/4093 257/718 |
| 6,557,675 B2 * | 5/2003 | Iannuzzelli | ........... | F16F 7/1028 188/380 |
| 6,633,489 B2 * | 10/2003 | Callahan | ............. | H01L 23/4006 257/E23.067 |
| 6,680,848 B2 * | 1/2004 | Petit | .................... | H01L 23/4006 361/704 |

(Continued)

*Primary Examiner* — Robert J Hoffberg
(74) *Attorney, Agent, or Firm* — Fountainhead Law Group P.C.

(57) ABSTRACT

A backing plate is provided. The backing plate is configurable to attach with at least one fastener to a heatsink with the heatsink on a first face of a printed circuit board and in thermal contact with a surface of a component mounted to the first face of the printed circuit board and the backing plate on a second, opposed face of the printed circuit board and in thermal contact with the second face of the printed circuit board. The backing plate has a plurality of fins and configurable to act as a further heatsink for the component and remove heat from the component through a solid portion of the printed circuit board.

19 Claims, 7 Drawing Sheets

(56) References Cited

U.S. PATENT DOCUMENTS

| | | | |
|---|---|---|---|
| 6,746,261 B2 * | 6/2004 | Petit | H05K 7/023 361/704 |
| 6,920,052 B2 * | 7/2005 | Callahan | H01L 23/4006 165/80.3 |
| 7,023,699 B2 * | 4/2006 | Glovatsky | H05K 7/20454 165/185 |
| 7,032,305 B2 * | 4/2006 | Petit | H01L 23/4006 29/832 |
| 7,145,774 B2 * | 12/2006 | Campini | H01L 23/3677 361/719 |
| 7,359,200 B2 * | 4/2008 | Zhou | H01L 23/4006 165/80.3 |
| 7,391,617 B2 * | 6/2008 | Veh | G06F 1/20 165/104.33 |
| 7,782,622 B1 * | 8/2010 | Sun | H01L 23/4006 165/80.3 |
| 8,243,454 B2 * | 8/2012 | Oota | H01L 23/42 165/80.3 |
| 9,668,377 B2 * | 5/2017 | Lim | H05K 7/2039 |
| 9,748,161 B2 * | 8/2017 | Hsu | H01L 23/367 |
| 10,170,391 B2 * | 1/2019 | Dickover | H05K 7/2039 |
| 2002/0108744 A1 * | 8/2002 | Bowman | H01L 23/4006 165/185 |
| 2005/0068741 A1 * | 3/2005 | Bailey | H01L 23/4006 361/719 |
| 2005/0117305 A1 * | 6/2005 | Ulen | H01L 23/4006 361/719 |
| 2007/0091578 A1 * | 4/2007 | Chang | H01L 23/3677 361/719 |
| 2007/0102795 A1 * | 5/2007 | Aoki | H01L 23/3675 257/675 |
| 2007/0217162 A1 * | 9/2007 | Zhou | H01L 23/4006 361/710 |
| 2013/0083504 A1 * | 4/2013 | Fukuzono | H01L 23/4006 361/783 |
| 2014/0071631 A1 * | 3/2014 | So | H01L 23/4006 361/720 |
| 2019/0170457 A1 * | 6/2019 | Zhai | F28F 19/002 |

* cited by examiner

HEATSINK BACKING PLATE

BACKGROUND

Many ICs (integrated circuits), including ASICs (application specific integrated circuits), generate a lot of heat and are facing increasing challenges in cooling. Large heatsinks for ICs often have structural backing plates on the opposite side of the PCB (printed circuit board) to reduce PCB deflection due to heat sink clamping force, and shock and vibration testing. Heatsink sizes, even with a backing plate, are generally limited due to system design constraints, and there is a limit as to how much heat can be dissipated in a given-sized heatsink. Therefore, there is a need in the art for a solution which overcomes the drawbacks described above.

SUMMARY

A backing plate is provided. The backing plate is configurable to attach with at least one fastener to a heatsink with the heatsink on a first face of a printed circuit board and in thermal contact with a surface of a component mounted to the first face of the printed circuit board and the backing plate on a second, opposed face of the printed circuit board and in thermal contact with the second face of the printed circuit board. The backing plate has a plurality of fins and configurable to act as a further heatsink for the component and remove heat from the component through a solid portion of the printed circuit board.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A heatsink backing plate, in various embodiments disclosed herein, is designed for improved thermal performance. Functionality is added to the structural backing plate under a printed circuit board (PCB), so that the backing plate becomes another heatsink. While perhaps not as thermally efficient as a heatsink on the top side of the printed circuit board contacting an ASIC (application specific integrated circuit) or other integrated circuit or other component directly, the backing plate with fins acting as a further heatsink is nonetheless able to dissipate some of the component heat and decrease requirements of the conventional heatsink on the top side of the printed circuit board.

Surface area of the backing plate with fins is greatly increased compared to a standard, flat backing plate. The addition of fins to the backing plate improves heat transfer to the surrounding fluid, which is typically air, but could be a liquid in some embodiments. Cooling benefits apply in both forced convection and natural convection designs.

Figure 1:
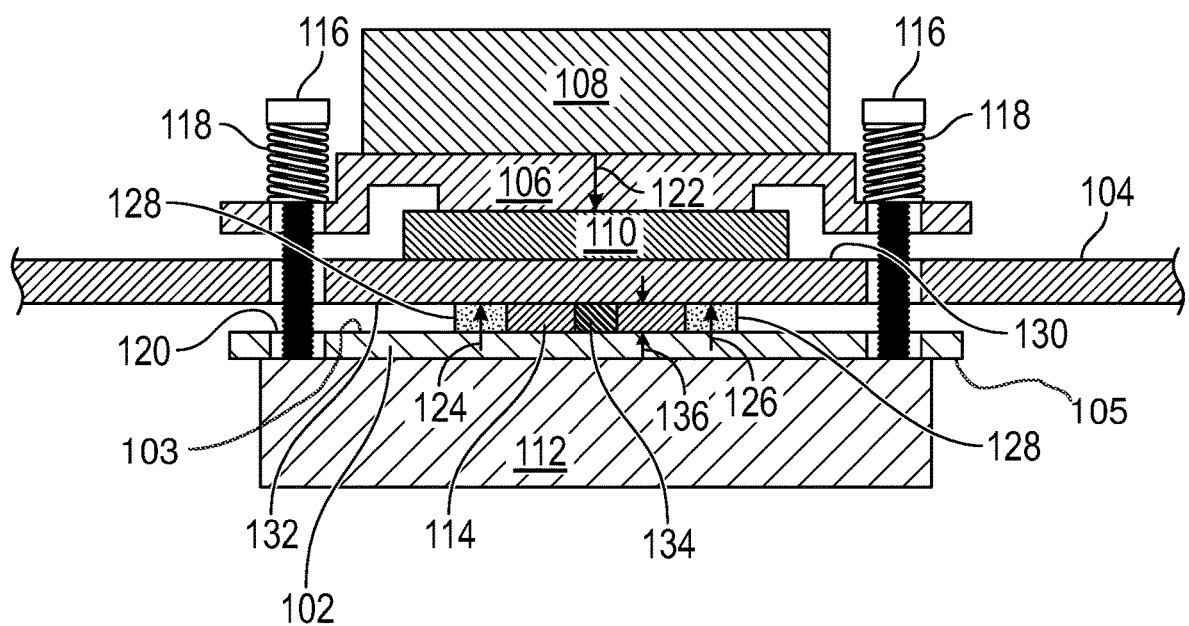
FIG. 1 is a cross-section view of a heatsink, printed circuit board and backing plate assembly, featuring an embodiment of a backing plate with fins as a further heatsink.

FIG. 1 is a cross-section view of a heatsink 106, printed circuit board 104 and backing plate 102 assembly, featuring an embodiment of a backing plate 102 with fins 112 as a further heatsink. The backing plate 102 includes a first face 103 that faces a bottom face 132 of the printed circuit board 104, and a second face 105 opposing the first face, with the fins 112 extending from the second face of the backing plate. Heat removal from a component 110 is performed by both the heatsink 106 and the backing plate 102 with fins 112. The component 110, which could be an ASIC (application specific integrated circuit), another IC (integrated circuit), or other component that generates heat, is mounted to the top face 130, or first face, of a printed circuit board 104, for example by soldering. On the top of the printed circuit board 104, the heatsink 106, which has fins 108, is in thermal contact with the component 110, for example by direct contact, or thermal contact through thermal grease or other thermal interface material (TIM). On the bottom of the printed circuit board 104, the backing plate 102 with fins 112 is in thermal contact with the bottom face 132, or second face, of the printed circuit board 104 through thermal interface material 114. Touch points 128, in some embodiments, extend from the backing plate 102, and offset a face of the backing plate 102 from the bottom face 132 of the printed circuit board 104, forming a gap 136 between the face of the backing plate 102 and the bottom face 132 of the printed circuit board 104. In some embodiments, a further component 134, such as a capacitor (but could be a transistor, an IC, etc.), is mounted to the bottom face 132 of the printed circuit board 104 and is accommodated in the gap 136. Also, the gap 136 makes room for the thermal interface material 114, which could be thermal grease, a thermal pad or other thermal conducting material.

Fasteners 116, 120 in combination with springs 118 apply clamping forces to clamp the heatsink 106 and backing plate 102 together, sandwiching the component 110 and the printed circuit board 104 between the heatsink 106 and backing plate 102 with fins 112. Some embodiments may include heatsinks that don't have flat fins, e.g., they can have round fins or pins. In some embodiments, fins 112 are cut so the fins are similar to rectangular pillars in shape. In the embodiment shown, each male fastener 116 (e.g., a bolt) passes through a spring 118 and mates to a female fastener 120 (e.g., a nut) embedded in or integral with the backing plate 102. With the heatsink 106 mounted to the component 110 and the top face 130 of the printed circuit board 104, and the backing plate 102 with fins 112 mounted to the bottom face 132 of the printed circuit board, the fasteners apply forces to the heatsink 106 and the backing plate 102. Example arrangements for various embodiments have one, two, three, four or more such fasteners. Further embodiments use other fastener arrangements readily devised, such as a single piece clamp, screws, tabs, wire, elastics, etc., or adhesive. While the fasteners exert clamping forces that mount or attach the heatsink 106 and the backing plate 102 to each other, each of these exerts forces that, left unbalanced, could warp a printed circuit board 104. In some embodiments, the touch points 128 are positioned so that forces 124, 126 exerted by the backing plate 102 through the touch points 128 to the bottom face 132 of the printed circuit board offset the force 122 exerted by the heatsink to the component 110 and through the component 110 to the top face 130 of the printed circuit board 104, preventing warping or other flexure of the printed circuit board 104.

Figure 2:
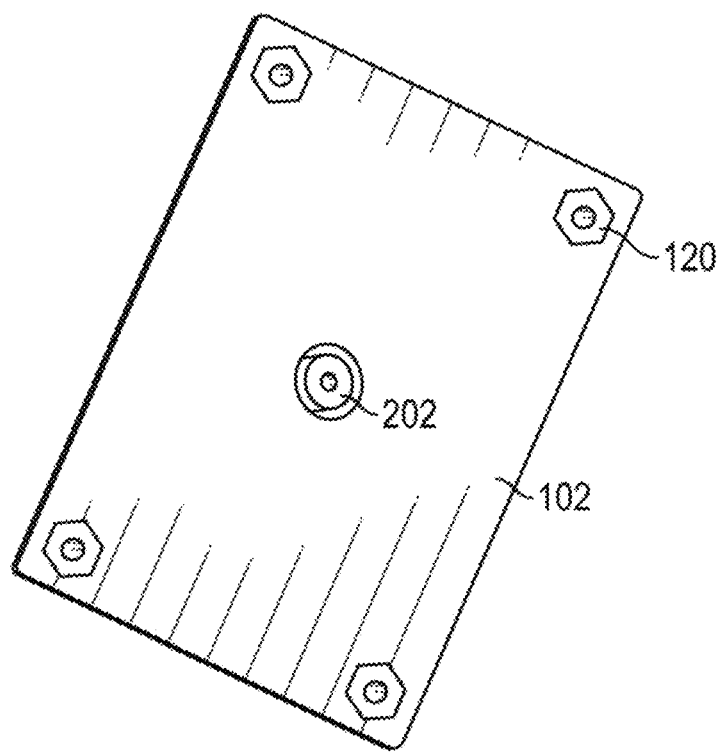
FIG. 2 is a perspective view of a backing plate suitable for embodiments of the backing plate with fins shown in FIG. 1.

FIG. 2 is a perspective view of a backing plate suitable for embodiments of the backing plate 102 with fins 112 shown in FIG. 1. In this embodiment, the backing plate 102 is a thick, rectangular piece of metal, with female fasteners 120 shown as threaded nuts embedded in the corners of the backing plate 102. Other shapes could be used. An aperture 202 in the center of the backing plate is available, and may be to be used as a touch point in some embodiments. Aluminum, aluminum alloys, copper, copper alloys and other metals, especially those with higher thermal conductivity, are suitable materials for making the backing plate 102, as are high thermal conductivity plastics. In some embodiments, less thermally conductive materials that are stronger, e.g., steel or steel alloys, can be used.

Figure 3:
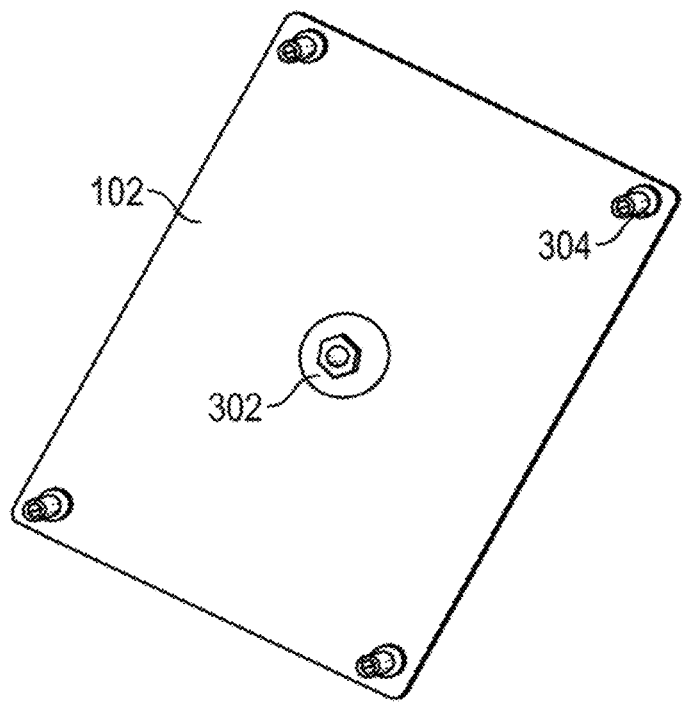
FIG. 3 is a perspective view of the backing plate of FIG. 2, with fasteners.

FIG. 3 is a perspective view of the backing plate 102 of FIG. 2, with fasteners 302, 304. Fasteners 304 at the corners are posts or studs, for example made by installing threaded male fasteners into the female fasteners 120. Fastener 304, at the center of the backing plate 102, may be used as a touch point in some embodiments. In a variation, fins could be made integral with the backing plate 102, for example by welding fins to the backing plate 102, or extruding, molding or otherwise forming the backing plate and fins together.

Figure 4:
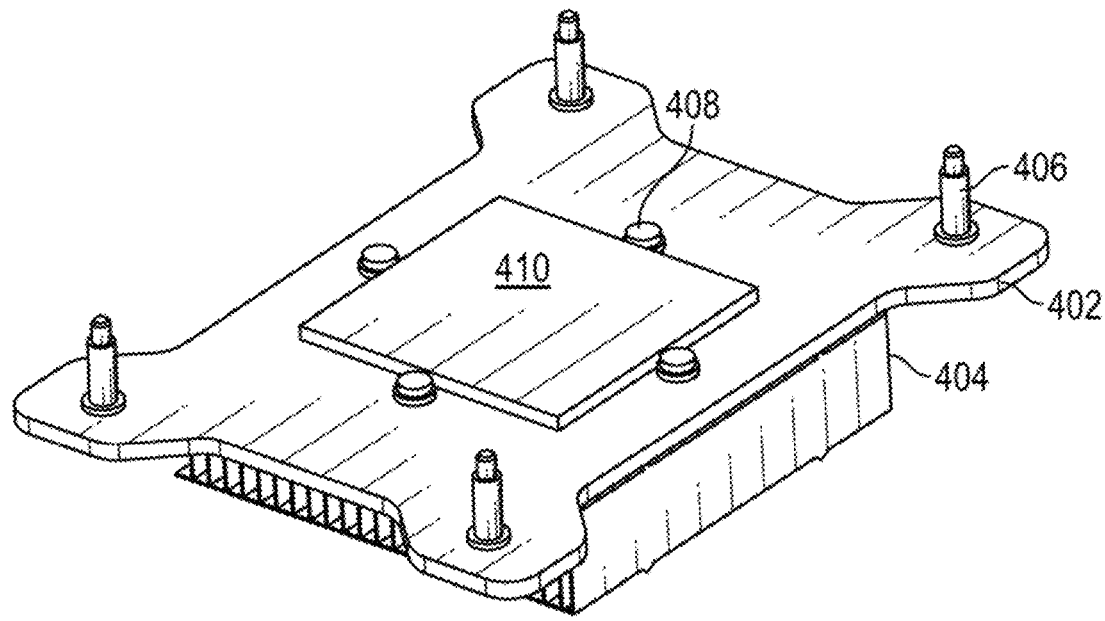
FIG. 4 is a perspective view of an embodiment of the backing plate with fins, further depicting touch points and thermal interface material.

FIG. 4 is a perspective view of an embodiment of the backing plate 402 with fins 404, further depicting touch points 408 and thermal interface material 410. Fasteners 406 are installed at corners of the backing plate 402, which is a different shape from the backing plate 102 shown in FIG. 3. Fins 404 could be made of aluminum, aluminum alloys, copper, copper alloys and other materials, or thermally conductive plastic, similar to, identical to, or different from material of which the backing plate 402 is made. Thermal interface material 410 could be thermal grease, a thermal pad, etc. These fasteners 406 appear as posts or towers, similar to those in FIG. 3. Touch points 408 can be made of insulative material, or conductive material, and attached to the backing plate 402 (e.g., with adhesive or fasteners), or formed integrally with the backing plate 402 for example through molding, pressing, stamping or other manufacturing process. In some embodiments, the touch points may be integrated into the corner fasteners 106.

Figure 5:
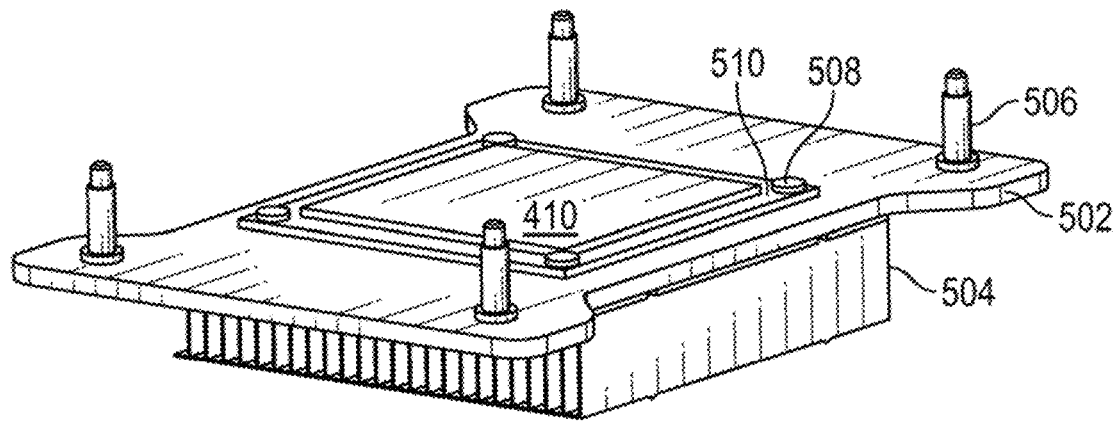
FIG. 5 is a perspective view of a further embodiment of the backing plate with fins, depicting a thermal pad.

FIG. 5 is a perspective view of a further embodiment of the backing plate 502 with fins 504, depicting a thermal pad 510. Further thermal interface material 410 is atop the thermal pad 510, which is itself a type of thermal interface material 410. Shape of the backing plate 502 and fins 504 is similar to the embodiment shown in FIG. 4, but could be different in further embodiments. Likewise, the materials of which the backing plate 502 and fins 504 are made could be similar to or different from the materials used in the embodiment shown in FIG. 4. Touch points 508 are attached to the thermal pad 510 in some embodiments, or made integrally with the thermal pad 510 in further embodiments. In still further embodiments, the touch points 508 appear through apertures in the thermal pad 510. Fasteners 506 are as posts or towers, similar to those in FIGS. 3 and 4.

Figure 6:
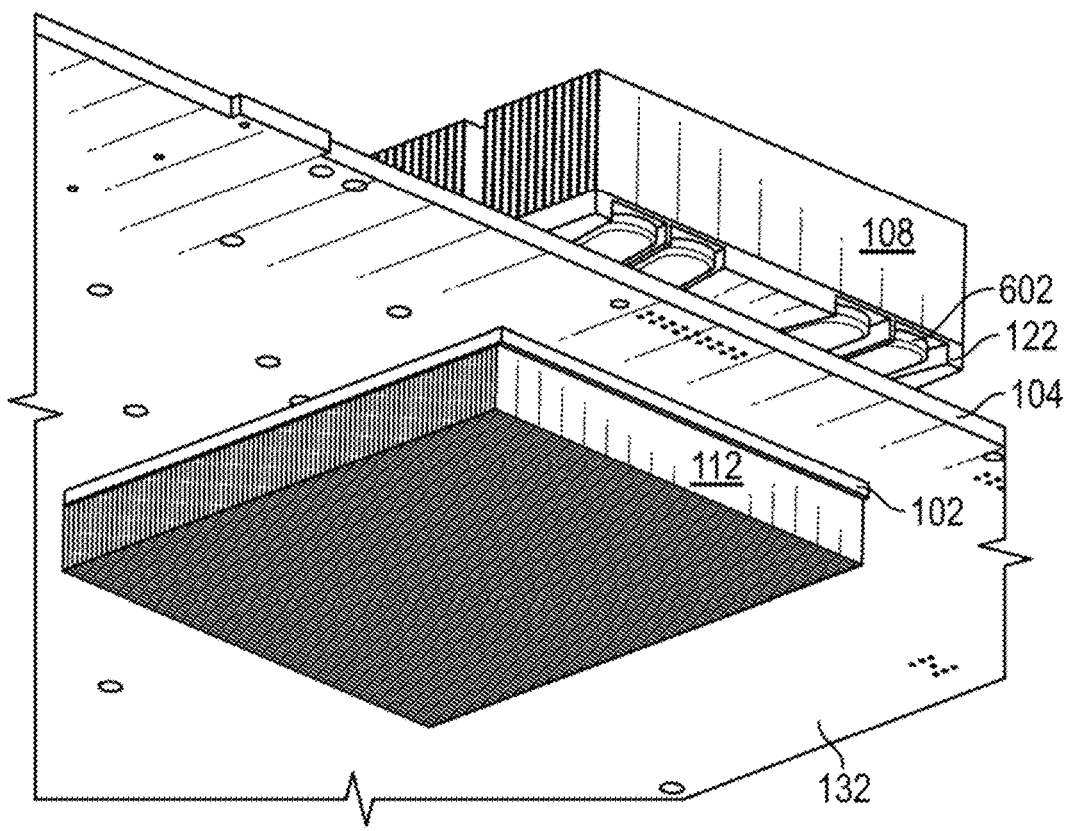
FIG. 6 is a perspective view of embodiments of the heatsink and backing plate with fins, mounted to a printed circuit board.
Figure 7:
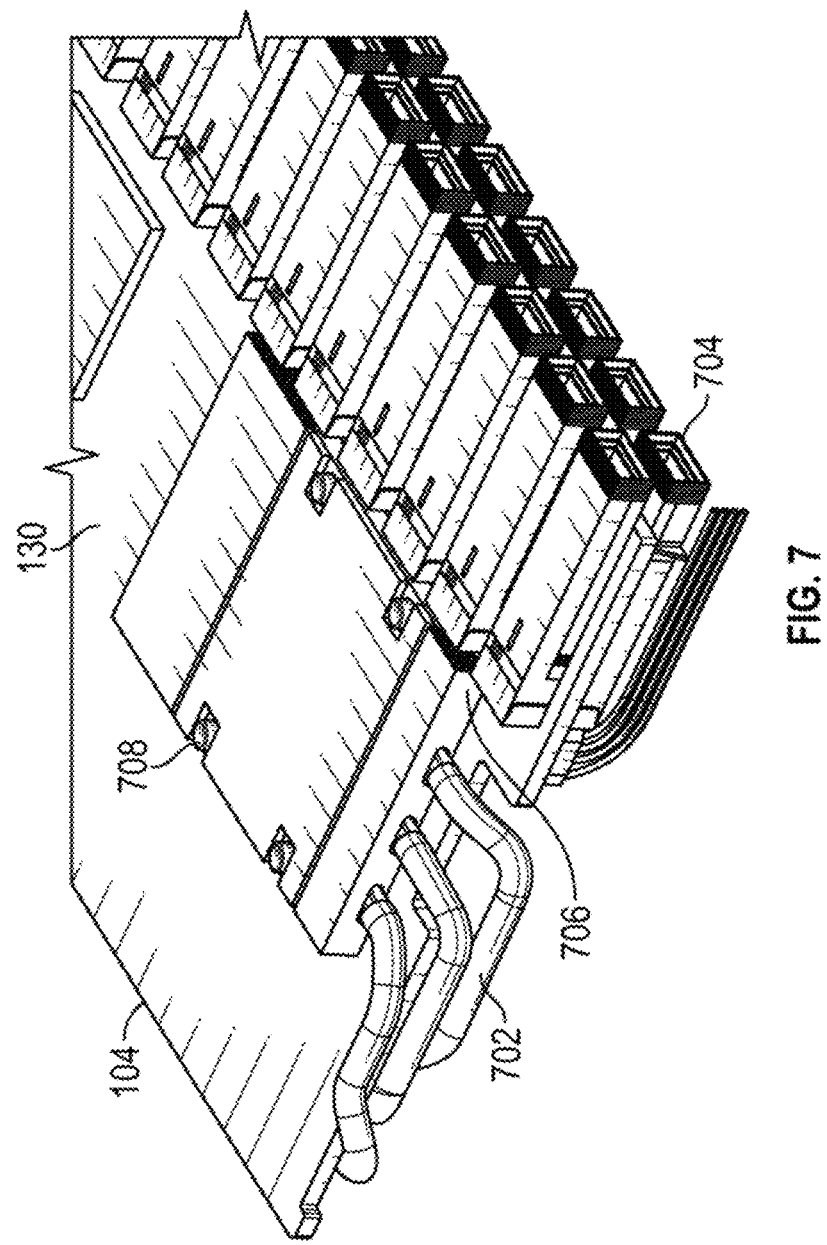
FIG. 7 is a perspective view of a further embodiment of the heatsink of FIG. 1, depicting a heatsink with a heat pipe.
Figure 8:
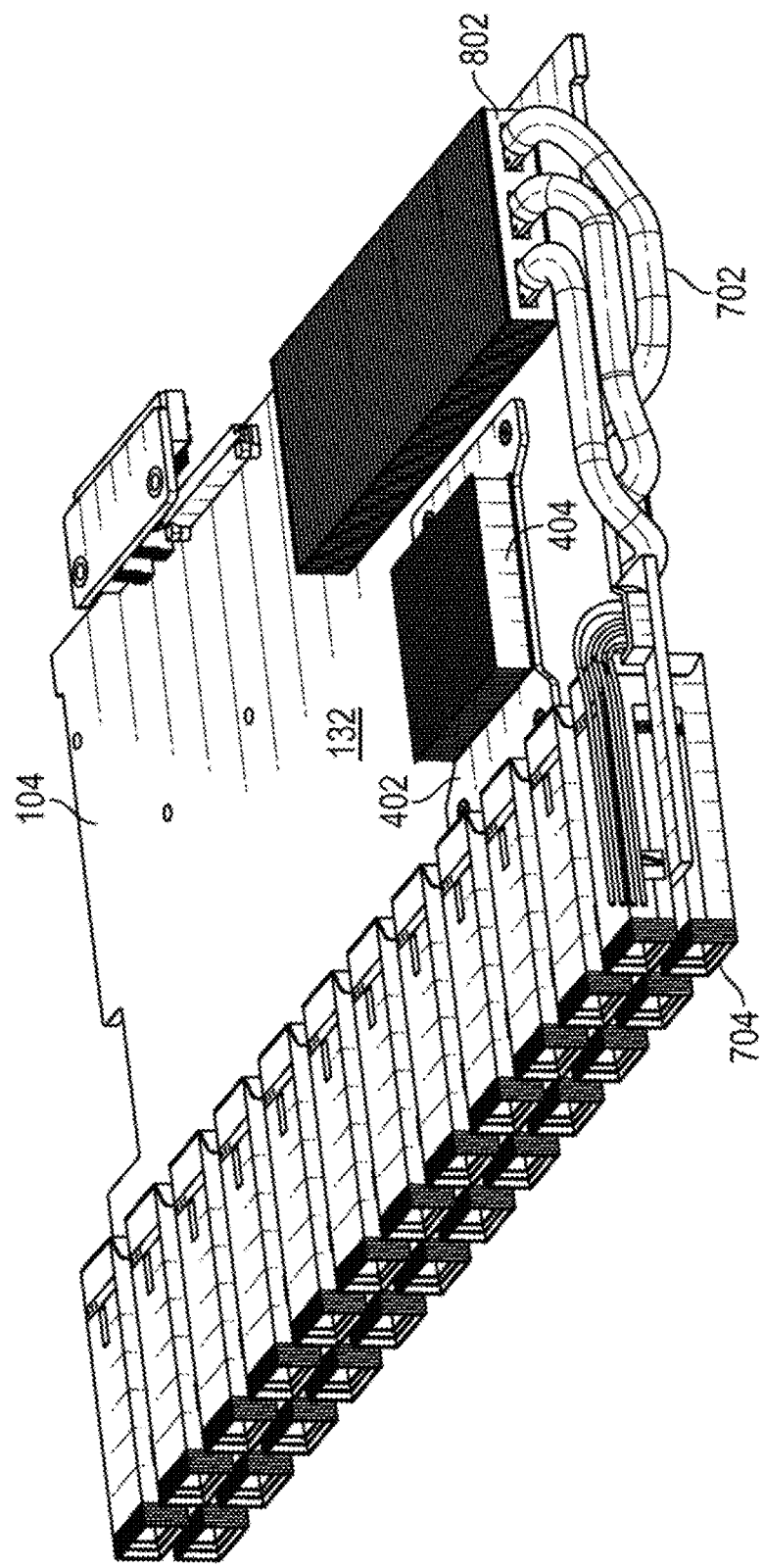
FIG. 8 is a perspective view of the opposite face of the printed circuit board depicted in FIG. 7, depicting the backing plate with fins shown in FIG. 4, and remote-mounted fins for the heat pipe of FIG. 7.

FIG. 6 is a perspective view of embodiments of the heatsink 106 (See FIG. 1) and backing plate 102 with fins 112, mounted to a printed circuit board 104. Fins 112 extend all the way to the edges of the backing plate 102, for maximal benefit. Heat pipes 602 in the heatsink 106 may extend beyond their illustrated position to the other areas as shown in FIGS. 7 and 8, in some embodiments. Fins 108 of the heatsink 106 are parallel to fins 112 of the backing plate 102, and work best with airflow parallel to both sets of fins 108, 112.

FIG. 7 is a perspective view of a further embodiment of the heatsink 106 of FIG. 1, depicting a heatsink 706 with a heat pipe 702. Mounted on the top side 130 of the printed circuit board 104, the heatsink 706 is shown with fasteners 708, which extend through to the backing plate 402 (see FIG. 8). In some embodiments, the heatsink 706 has no fins and relies solely on the heat pipe 702 for extraction of heat from a component 110. In other embodiments, the heatsink 706 has both the heat pipe 702 and fins. Connectors 704 along one edge of the printed circuit board 104 are arranged, in some embodiments, for network connections, and could be QSFP (quad small form package), QSFP DD (quad small form package, double density), OSFP (octal small form package) or other connectors.

FIG. 8 is a perspective view of the opposite face of the printed circuit board 104 depicted in FIG. 7, depicting the backing plate 402 with fins 404 shown in FIG. 4, and remote-mounted fins 802 for the heat pipe 702 of FIG. 7. Locating the backing plate 402 with fins 404, and remote-mounted fins 802 for the heat pipe 702 on the bottom face 132 of the printed circuit board 104 has packaging height and cooling advantages for the printed circuit board 104 and components of the system. This way, there is cooling on both sides of the printed circuit board 104, and the height of the top face of the printed circuit board 104, including components, can be reduced in comparison to the height needed on top for taller fins doing all of the cooling from just one heatsink.

Figure 9:
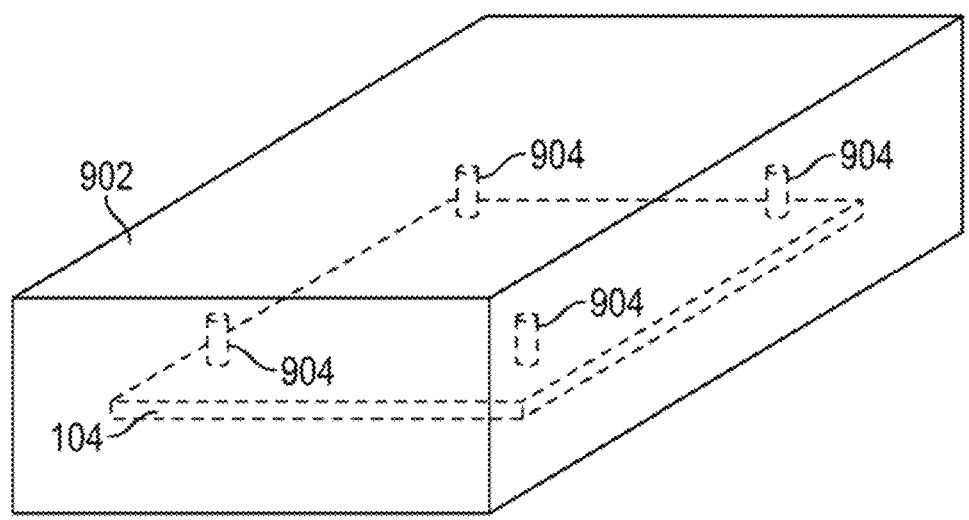
FIG. 9 is a perspective view of a housing, with the printed circuit board suspended in the housing.

FIG. 9 is a perspective view of a housing 902, with the printed circuit board 104 suspended in the housing 902. Mountings 904, which could be posts, pegs, columns, fasteners, brackets, standoffs, or other supports, attach the printed circuit board 104 to a ceiling, floor, wall(s) or other printed circuit boards, components or fixtures of the housing 902. Suspending the printed circuit board 104 supports maximum airflow above and below the printed circuit board 104 in order to take advantage of the cooling offered by the embodiments of the heatsink 106 and backing plate 102 with fins 112 shown in FIGS. 1-8, and variations thereof.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "I" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An apparatus comprising:
a backing plate, to attach with at least one fastener to a first heatsink with the first heatsink on a first face of a printed circuit board and in thermal contact with a surface of a first component mounted to the first face of the printed circuit board, and the backing plate on a second, opposed face of the printed circuit board, and the backing plate being in thermal contact with the second face of the printed circuit board, and the backing plate including a plurality of fins, the backing plate acting as a second heatsink for the first component and removing heat from the first component through a solid portion of the printed circuit board;
a plurality of insulated touch points arranged to offset a first face of the backing plate from the second face of the printed circuit board; and
at least one second component mounted to the second face of the printed circuit board and in contact with the first face of the backing plate, and the plurality of fins removing heat from the at least one second component.

2. The apparatus of claim 1, further comprising:
a thermal interface material on the first face of the backing plate, arranged to form the thermal contact with the second face of the printed circuit board.

3. The apparatus of claim 1, further comprising:
a plurality of springs arranged with the at least one fastener to apply a clamping force sandwiching the backing plate, the printed circuit board, the first component and the first heatsink.

4. The apparatus of claim 1, wherein the first heatsink has a heat pipe.

5. The apparatus of claim 1, wherein each of the backing plate and the plurality of fins comprises aluminum, aluminum alloy, copper, or copper alloy.

6. The apparatus of claim 1, wherein the at least one fastener comprises:
a plurality of female fasteners, integral with the backing plate; and
a plurality of male fasteners.

7. An apparatus comprising:
a heatsink in thermal contact with a first component mounted to a first face of a printed circuit board;
a backing plate attached to the heatsink via a plurality of fasteners and in thermal contact to a second, opposed face of the printed circuit board, the backing plate including a plurality of fins arranged to remove heat from the first component through the backing plate via the thermal contact to the printed circuit board;

a plurality of insulated touch points extending from a first face of the backing plate opposed to a second face of the backing plate having the plurality of fins; and one or more second components on the second face of the printed circuit board, each of the one or more second components in contact with the first face of the backing plate.

8. The apparatus of claim 7, further comprising:
the backing plate comprising aluminum, aluminum alloy, copper or copper alloy; and
the plurality of fins comprising aluminum, aluminum alloy, copper or copper alloy.

9. The apparatus of claim 7, further comprising:
a heat pipe, arranged to remove heat from the heatsink.

10. The apparatus of claim 7, further comprising:
a thermal interface material in thermal contact with the backing plate for the thermal contact to the second face of the printed circuit board.

11. The apparatus of claim 7, wherein the plurality of fasteners comprises a plurality of female fasteners integral with the backing plate, a plurality of male fasteners, and a plurality of springs.

12. The apparatus of claim 7, wherein the plurality of insulated touch points is attached to the backing plate.

13. An apparatus comprising:
a printed circuit board having a first component mounted to a first face of the printed circuit board, and a second face of the printed circuit board opposed to the first face of the printed circuit board;
a first heatsink in a first thermal contact to the first component;
a backing plate comprising:
  a plurality of insulated touch points arranged to form a gap between a first face of the backing plate and the second face of the printed circuit board, and the plurality of insulated touch points arranged to provide first forces exerted by the backing plate through the plurality of insulated touch points to the second face of the printed circuit board, the provided first forces offsetting an opposing second force exerted by the first heatsink to the first component and through the first component to the first face of the printed circuit board; and
  a plurality of fins arranged to remove heat from the first component,
the backing plate acting as a second heatsink and in a second thermal contact with the second face of the printed circuit board, the backing plate attached to the first heatsink by a plurality of fasteners to mount the first heatsink to the first component and mount the backing plate to the second face of the printed circuit board; and
one or more second components in the gap between the first face of the backing plate and the second face of the printed circuit board, each of the one or more second components extending in the gap to be in contact with the first face of the backing plate and the second face of the printed circuit board.

14. The apparatus of claim 13, further comprising:
a housing, with the printed circuit board suspended therein.

15. The apparatus of claim 13, wherein the plurality of insulated touch points extend from the first face of the backing plate and are arranged to contact the second face of the printed circuit board and exert the first forces that counteracts the opposing second force exerted by the first heatsink to the first component, to prevent flexing of the printed circuit board.

16. The apparatus of claim 13, wherein the one or more second components are mounted to the second face of the printed circuit board.

17. The apparatus of claim 13, further comprising:
a heat pipe coupled to the first heatsink.

18. The apparatus of claim 13, further comprising:
a thermal interface material between the backing plate and the second face of the printed circuit board, to form the second thermal contact of the backing plate to the second face of the printed circuit board.

19. The apparatus of claim 13, further comprising:
a plurality of springs, the plurality of fasteners passing therethrough to mount the first heatsink and the backing plate to each other with the first component and the printed circuit board sandwiched between the first heatsink and the backing plate.

* * * * *